(12) United States Patent
Hopper et al.

(10) Patent No.: US 6,285,057 B1
(45) Date of Patent: Sep. 4, 2001

(54) SEMICONDUCTOR DEVICE COMBINING A MOSFET STRUCTURE AND A VERTICAL-CHANNEL TRENCH-SUBSTRATE FIELD EFFECT DEVICE

(75) Inventors: Peter J. Hopper, San Jose; Christoph Pichler, San Francisco, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/441,497

(22) Filed: Nov. 17, 1999

(51) Int. Cl.[7] .......................... H01L 29/76; H01L 29/94; H01L 31/062
(52) U.S. Cl. ............................ 257/330; 257/332
(58) Field of Search ...................... 257/330, 332

(56) References Cited

U.S. PATENT DOCUMENTS 5,770,878 * 6/1998 Beasom .
5,895,951 * 4/1999 So et al. .
6,043,543 * 3/2000 Klose .

OTHER PUBLICATIONS

S. Wolf, Silicon Processing for the VLSI Era, vol. 1—Process Technology, pp. 185, 522 (Lattice Press, 1986).
S. Wolf, Silicon Processing for the VLSI Era, vol. 2—Process Integration, pp. 66–75, 350 (Lattice Press, 1990).
R.S. Muller and T.I. Kamins, Device Electronics for Integrated Circuits—Second Edition, pp. 436–437 (John Wiley & Sons, 1986).

* cited by examiner

Primary Examiner—Stephen D. Meier
(74) Attorney, Agent, or Firm—Stallman & Pollack LLP

(57) ABSTRACT

A semiconductor device that provides for substrate current exiting a MOSFET structure, and hence the performance thereof, to be independently and controllably tuned. The semiconductor device includes a semiconductor substrate of a first conductivity type, a conventional MOSFET structure disposed thereon, and at least one vertical-channel trench-substrate field effect device disposed in the semiconductor substrate. The vertical-channel trench-substrate field effect device includes a vertical-channel region beneath the MOSFET structure. During operation, substrate current exiting the MOSFET structure can be independently and controllably tuned by applying a potential bias to the vertical-channel trench-substrate field effect device that "pinches-off" the vertical-channel region. The vertical-channel trench-substrate field effect device includes an expanded trench that extends from an upper surface of the semiconductor substrate to beneath the MOSFET structure and a dielectric shallow trench spacer (e.g., silicon dioxide or silicon nitride dielectric shallow trench spacer) that is disposed along an upper portion of the sidewall of the expanded trench. The vertical-channel trench-substrate field effect device also includes a $SiO_2$ trench liner layer disposed on those portions of the sidewall of the expanded trench that are not covered by the dielectric shallow trench spacer, and an electrically conductive trench fill layer (e.g., in-situ doped polysilicon) in the expanded trench. The vertical-channel region can be "pinched-off," and the substrate current exiting the MOSFET structure independently and controllably tuned, by applying a potential bias to the electrically conductive trench fill layer. Also, a process for manufacturing the semiconductor device that is compatible with conventional IC manufacturing techniques.

8 Claims, 6 Drawing Sheets

SEMICONDUCTOR DEVICE COMBINING A MOSFET STRUCTURE AND A VERTICAL-CHANNEL TRENCH-SUBSTRATE FIELD EFFECT DEVICE

BACKGROUND OF THE INVENTION

1. Field of the Invention

The present invention relates to semiconductor devices and, in particular, to a semiconductor device that combines a vertical-channel trench-substrate field effect device with a Metal-Oxide-Silicon Field Effect Transistor (MOSFET) structure and to a method for its manufacture.

2. Description of the Related Art

The performance of MOSFET devices (for example, their speed and power consumption) can be affected by the level of substrate current exiting the MOSFET device. For example, the snapback voltage and/or holding voltage of a conventional N-channel MOSFET ESD device, under high drain and gate bias conditions, can be degraded by substrate current (made up of carriers, i.e. holes, generated through impact ionization) exiting the channel region of the N-channel MOSFET device and flowing to a semiconductor substrate underlying the N-channel MOSFET device.

The use of Silicon-On-Insulator (SOI) technology provides for a MOSFET device to be electrically isolated from an underlying semiconductor substrate by an insulating layer. See S. Wolf, *Silicon Processing for the VLSI Era, Volume 2—Process Integration*, 66–75, Lattice Press (1990). Although SOI technology can suppress the level of substrate current exiting a MOSFET device, it does not provide a means for independently and controllably tuning the level of substrate current, and hence the performance, of a MOSFET device.

Still needed in the field, therefore, is a semiconductor device that provides a means for independently and controllably tuning the substrate current, and hence the performance, of a MOSFET device. Also needed is a process for manufacturing such a semiconductor device that is compatible with conventional integrated circuit (IC) processing techniques.

SUMMARY OF THE INVENTION

The present invention provides a semiconductor device wherein the substrate current, and hence the performance, of a MOSFET structure can be independently and controllably tuned (i.e. regulated). In this regard, the term "independently" refers to the ability to regulate the substrate current exiting the MOSFET structure using an input signal (for example, an applied potential bias) to the semiconductor device that is not an input signal to the MOSFET structure itself. In other words, the input signals that control the level of the substrate current exiting the MOSFET structure are exclusive of those to the MOSFET structure. Semiconductor devices according to the present invention include a semiconductor substrate of a first conductivity type, a MOSFET structure disposed on the semiconductor substrate, and at least one vertical-channel trench-substrate field effect device disposed in the semiconductor substrate. The vertical-channel trench-substrate field effect device includes a vertical-channel region beneath the MOSFET structure.

During operation of semiconductor devices according to the present invention, substrate current exiting the MOSFET structure can be independently and controllably tuned by "pinching-off" the vertical-channel region of the vertical-channel trench-substrate field effect device. The vertical-channel region can be "pinched-off" (i.e. narrowed, either partially or completely) by applying a potential bias to the vertical-channel trench-substrate field effect device.

In one embodiment of a semiconductor device according to the present invention, the MOSFET structure includes a gate silicon dioxide layer on the semiconductor substrate, a silicon gate (e.g., a polysilicon gate or an amorphous silicon gate) overlying the gate silicon dioxide layer, and source and drain regions of a second conductivity type in the semiconductor substrate. The vertical-channel trench-substrate field effect device of this embodiment includes an expanded trench that extends from the upper surface of the semiconductor substrate to beneath the MOSFET structure, as well as a dielectric shallow trench spacer (e.g., a silicon dioxide or silicon nitride dielectric shallow trench spacer) disposed along an upper portion of the sidewall of the expanded trench. Furthermore, the dielectric shallow trench spacer is adjacent to the source and drain regions of the MOSFET structure. The vertical-channel trench-substrate field effect device further includes a silicon dioxide ($SiO_2$) trench liner layer disposed on those portions of the sidewalls of the expanded trench that are not covered by the dielectric shallow trench spacer, as well as an electrically conductive trench fill layer (e.g., in-situ doped polysilicon) in the expanded trench. The vertical-channel region can be "pinched-off," and the substrate current independently and controllably tuned, by applying a potential bias to the electrically conductive trench fill layer. This potential bias can be applied to the electrically conductive trench fill layer by means of an electrical contact to the electrically conductive trench fill layer.

Also provided is a process for manufacturing a semiconductor device according to the present invention that is compatible with conventional integrated circuit (IC) manufacturing techniques. The process includes the step of first providing a semiconductor substrate (for example, a silicon substrate), followed by the formation of a shallow trench in the semiconductor substrate. The shallow trench demarcates an active area region in the semiconductor substrate. Dielectric shallow trench sidewall spacers are then formed on the sidewalls of the shallow trench, followed by an enlargement, by isotropic silicon etching, of the shallow trench to form an expanded trench that extends beneath the active area region and defines a vertical-channel region thereunder. A $SiO_2$ trench liner layer is subsequently formed on the surfaces of the expanded trench and an electrically conductive trench fill layer (for example, an in-situ doped polysilicon layer) is then formed in the expanded trench. Finally, a MOSFET structure is fabricated on the semiconductor substrate in the active area region.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

To be consistent throughout the present specification and for clear understanding of the present invention, the following definitions are hereby provided for the terms used therein:

The term "conformal" refers to material layers formed on a substrate such that the thickness of the material layer is essentially identical over any substrate surface topography (e.g. the thickness is essentially identical on both the vertical and horizontal surfaces of a previously formed and/or patterned layer). See S. Wolf and R. N. Tauber, *Silicon Processing for the VLSI Era, Volume 1—Process Technology,* 185, Lattice Press (1986), which is hereby incorporated by reference, for a further discussion of the term "conformal".

The terms "anisotropic" and "anisotropically" refer to an etch and etching technique wherein the etch proceeds essentially or primarily in one direction, for example vertically. See S. Wolf and R. N. Tauber, *Silicon Processing for the VLSI Era, Volume 1—Process Technology,* 522, Lattice Press (1986), which is hereby incorporated by reference for a further discussion of the term "anisotropic." Moreover, the terms "isotropic" and "isotropically" refer to an etch and etching technique wherein the etch proceeds essentially or primarily in all directions (e.g., both vertically and horizontally).

Figure 1:
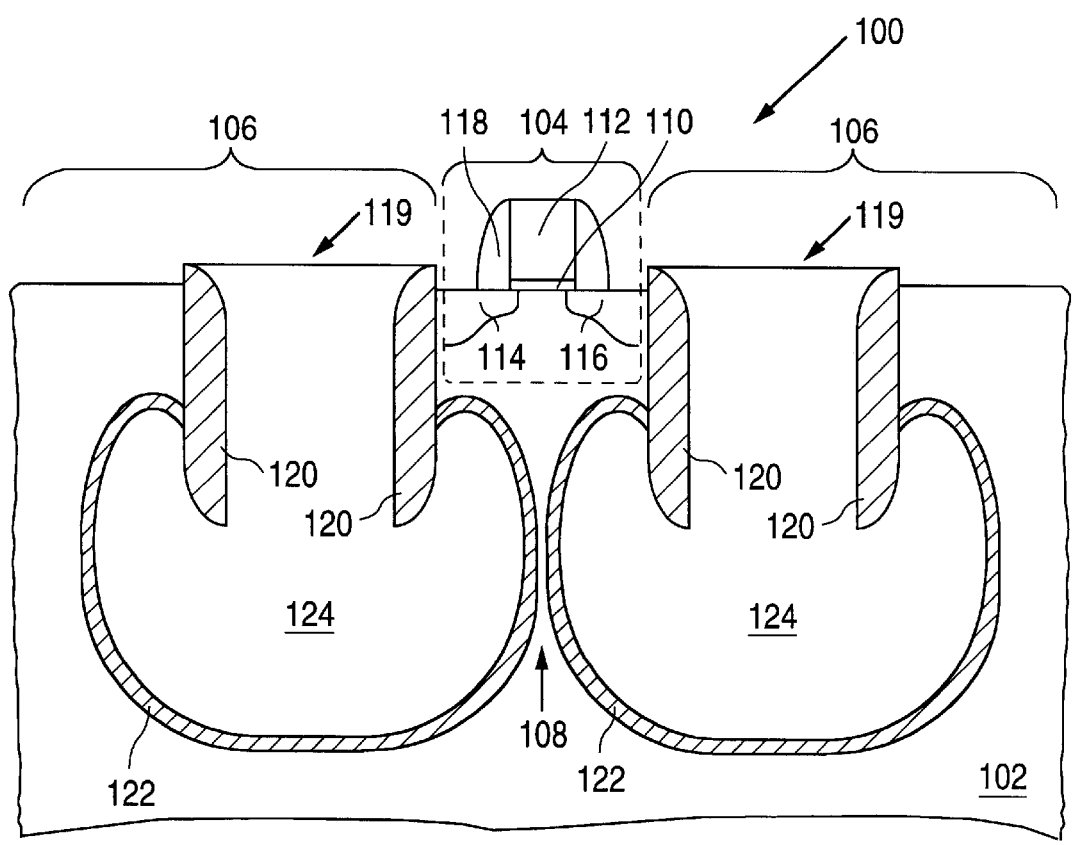
FIG. 1 is a cross-sectional view of a semiconductor device according to the present invention.

FIG. 1 illustrates a semiconductor device 100 according to the present invention that includes a semiconductor substrate 102 of a first conductivity type, a MOSFET structure 104 (essentially encompassed by the dashed lines) formed on the semiconductor substrate 102 and a vertical-channel trench-substrate field effect device 106. The vertical-channel trench-substrate field effect device 106 includes a vertical-channel region 108 underneath the MOSFET structure 104. The width of vertical-channel region 108 at its narrowest point is typically from 0.08 to 0.12 microns.

The MOSFET structure 104 includes a gate silicon dioxide layer 110 (typically 20–300 angstroms in thickness), a silicon gate layer 112 formed, for example, of polysilicon or amorphous silicon, and source and drain regions 114 and 116 respectively of a second conductivity type in the semiconductor substrate. MOSFET structure 104 also includes gate sidewall spacers 118. Vertical-channel trench-substrate field effect device 104 also includes an expanded trench 119 extending from the upper surface of the semiconductor substrate 102 to beneath the MOSFET structure 104, as well as a dielectric shallow trench spacer 120 disposed along an upper portion of the sidewall of the expanded trench 119 and adjacent to the source and drain regions 114 and 116. The dielectric shallow trench spacer 120 extends from the surface of the semiconductor substrate into the expanded trench 119 and serves to electrically isolate the MOSFET structure 104 from the expanded trench 119. Dielectric shallow trench spacer 120 can be formed, for example, from silicon dioxide or silicon nitride. The vertical-channel trench-substrate field effect device 106 also includes a $SiO_2$ trench liner layer 122 disposed on the sidewalls of the expanded trench 119, as well as an electrically conductive trench fill layer 124 (fabricated from, for example, in-situ doped polysilicon) in the expanded trench 119.

Semiconductor devices according to the present invention provide for independently and controllably tuning the substrate current exiting MOSFET structure 104 by "pinching-off" the vertical-channel region 108. For example, the vertical-channel region 108 can be pinched-off via an electrical field effect induced by applying a potential bias to the electrically conductive trench fill layer 122. This potential bias can be applied through an electrical contact (not shown in the FIGS.) to the electrically conductive trench fill layer 122. The vertical-channel trench-substrate field effect device 106 is, therefore, behaving like a vertical-channel FET that exerts its influence from both sides of the vertical-channel region 108.

Semiconductor devices according to the present invention can be beneficially employed in a variety of manners. For example, if the semiconductor device is operated in a manner which pinches-off the vertical-channel region, then carriers that would have been consumed as substrate current will be rerouted to the source region of the MOSFET structure, thereby forward biasing the source-channel junction and thus enhancing the speed of the MOSFET in either normal CMOS operation on in the case of ESD bipolar mode operation (snap back). The semiconductor devices according to the present invention can thus be employed in an electrostatic discharge (ESD) protection device where it is desirable to independently control the level of substrate current exiting a MOSFET structure and, hence, the onset of snapback breakdown and bipolar behavior of the ESD protection device. See S. Wolf, *Silicon Processing for the VLSI Era, Volume 2—Process Integration,* 350, Lattice Press (1990) for a further description of snapback breakdown.

In general, semiconductor devices according to the present invention provide a means for changing the performance of the MOSFET structure by controlling the effective resistance of the vertical-channel region. This ability to change the effective resistance of the vertical-channel region also provides a means for impacting the source region-substrate bias (i.e., "body-effect") of the MOSFET structure and, thereby, independently and controllably tuning the threshold voltage of the MOSFET structure. See R. S. Muller and T. I. Kamins, *Device Electronics for Integrated Circuits—Second Edition,* 436–437, John Wiley & Sons (1986) for a discussion of the MOSFET "body-effect."

Figure 2:
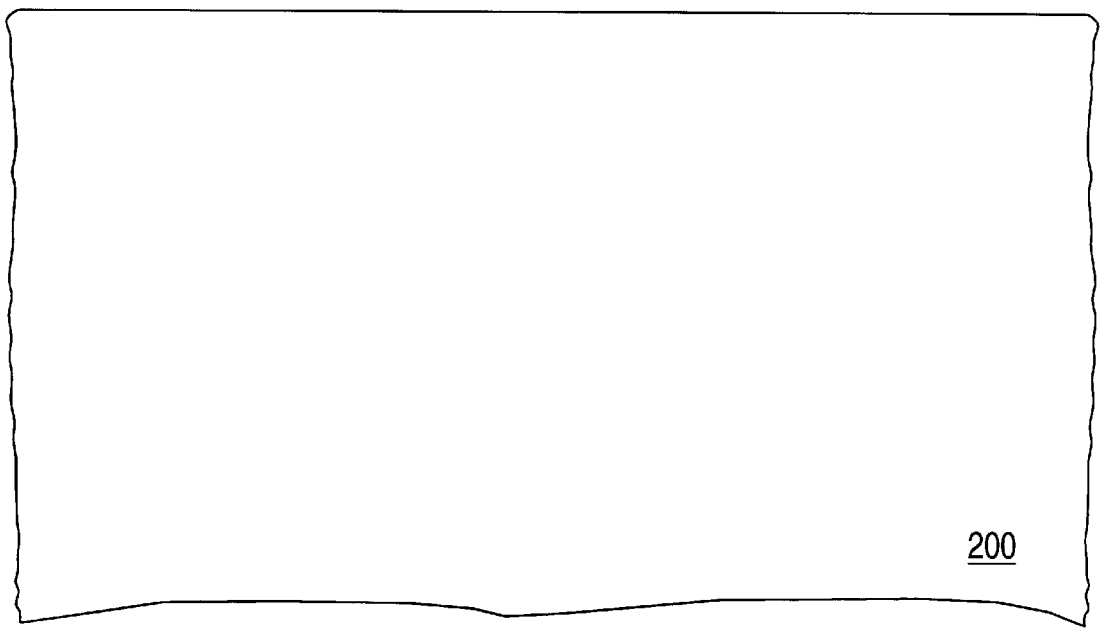
FIGS. 2–11 are cross-sectional views illustrating stages in a process in accordance with the present invention.
Figure 3:
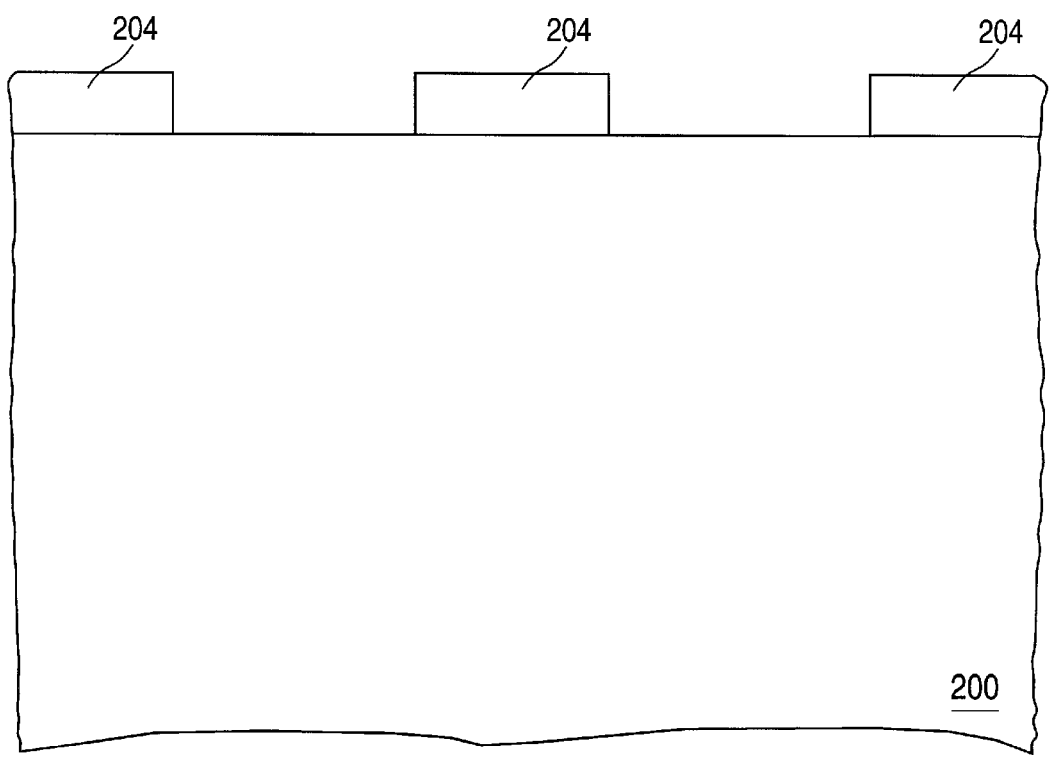
Figure 4:
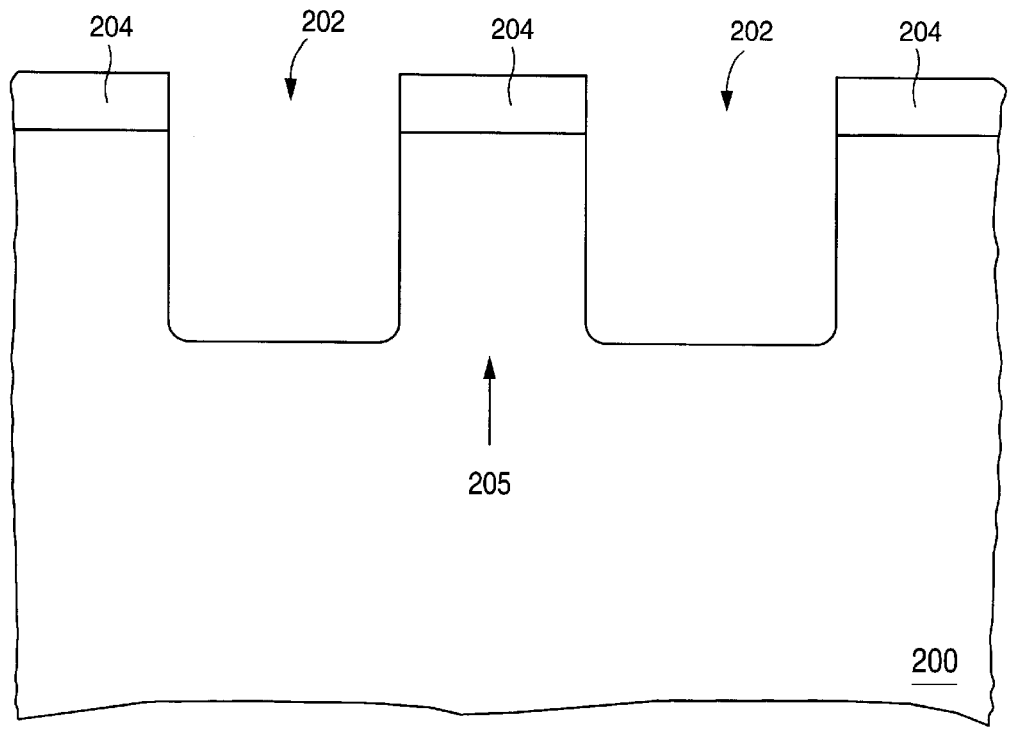
Figure 5:
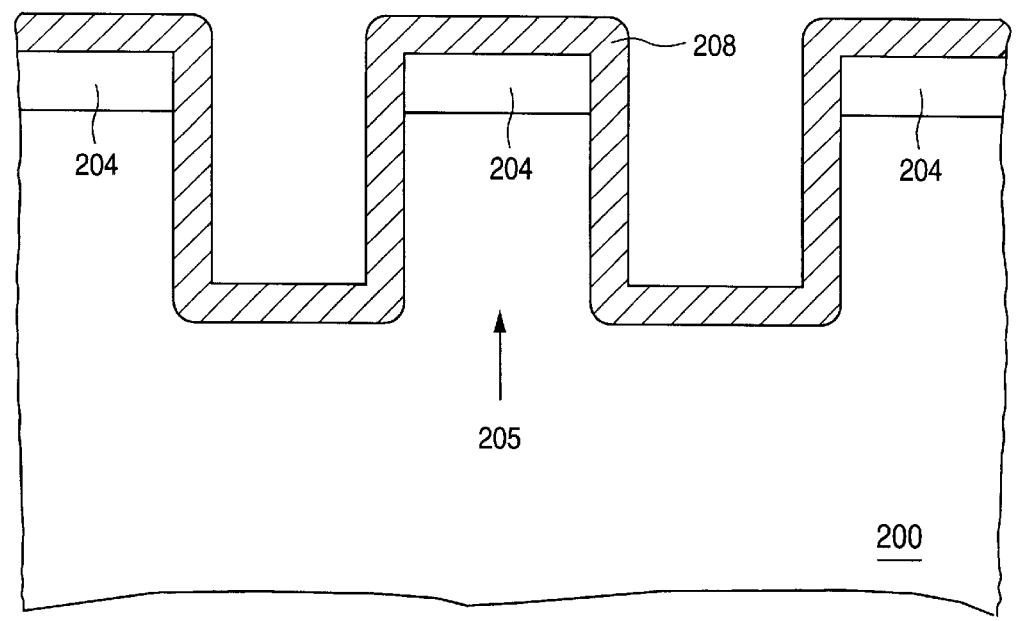

Also provided is a process of manufacturing semiconductor devices according to the present invention that is compatible with standard integrated circuit manufacturing techniques. FIGS. 2–11 illustrate stages in such a process. The process includes the steps of first providing a semiconductor substrate 200 (for example, a silicon substrate such as a silicon wafer), as illustrated in FIG. 2, followed by the formation of at least one shallow trench 202 in the semiconductor substrate. The shallow trench 202 can be formed, for example, by first forming a patterned hard mask 204 on the semiconductor substrate 200 (see FIG. 3) and then anisotropically etching the semiconductor substrate 200 to form shallow trench 202. The shallow trench 202 demarcates an active area region 205 in the semiconductor substrate 200. The resulting structure is illustrated in FIG. 4.

The anisotropic etch can be conducted using conventional techniques that are well known to one skilled in the art. Patterned hard mask 204 can be formed of any conventional hard mask material that is compatible with etching a shallow trench 202 into a semiconductor substrate 200. For example, patterned hard mask 204 can be a composite hard mask composed of a layer of silicon nitride overlying a layer of silicon dioxide. The dimensions of shallow trench 202 will depend on the particular process technology being employed. However, for a standard 0.18 micron CMOS process technology, shallow trench 202 is typically 0.1 to 0.5 microns in depth and 0.6 to 1.0 microns in width.

Figure 6:
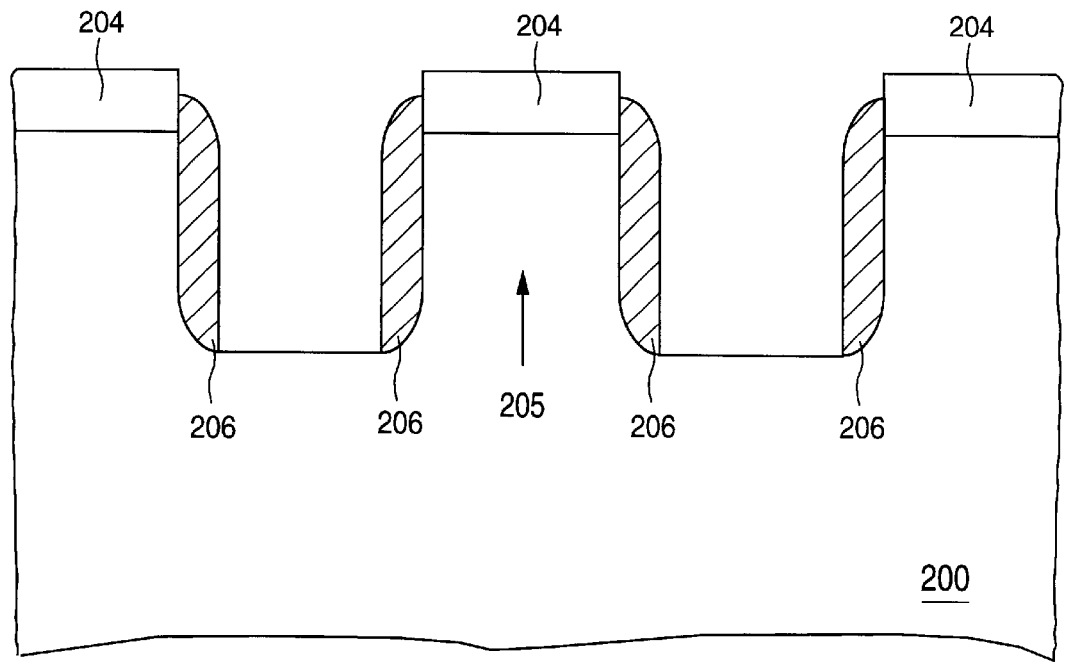

Next, dielectric shallow trench spacers 206 are formed along the sidewalls of the shallow trench 202, as illustrated in FIG. 6. The width of the dielectric shallow trench spacers 206 is typically in the range of 0.08 to 0.12 microns. The depth of the dielectric shallow trench spacers 206 can be, for example, 0.1 to 0.5 microns. Dielectric shallow trench spacers 206 can be fabricated from, for example, silicon dioxide or silicon nitride by first depositing a conformal dielectric spacer layer 208 (see FIG. 5) by, for example, chemical vapor deposition or plasma enhanced chemical vapor deposition. The conformal dielectric spacer layer 208 is then etched back to form dielectric shallow trench spacers 206.

Figure 7:
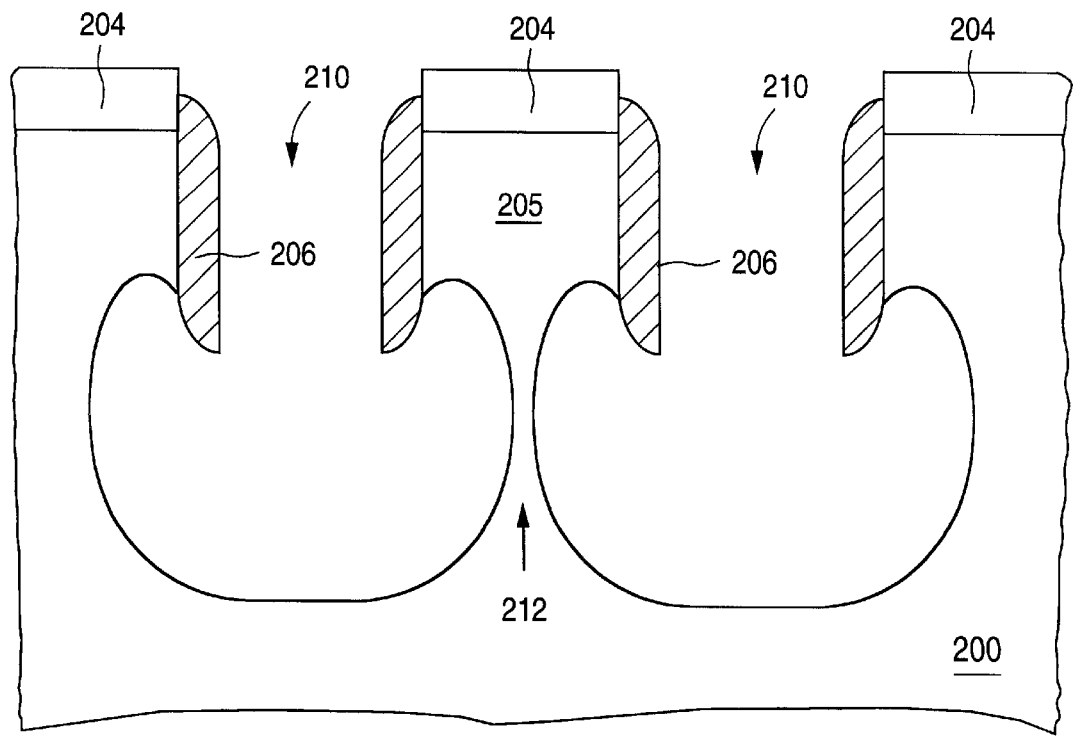

Next, the shallow trench 202 is enlarged to form an expanded trench 210 that extends beneath the active area region 205 and defines a vertical-channel region 212 beneath the active area region 205. The resultant structure is illustrated in FIG. 7. The shallow trench 202 can be enlarged using conventional isotropic etching techniques, such as an isotropic plasma etch employing sulfur hexafluoride ($SF_6$) or a conventional wet silicon etch. In the embodiment of FIG. 7, the expanded trench 210 has a cross-sectional profile that is balloon-like or bubble-like, although other cross-sectional profiles are possible.

Figure 8:
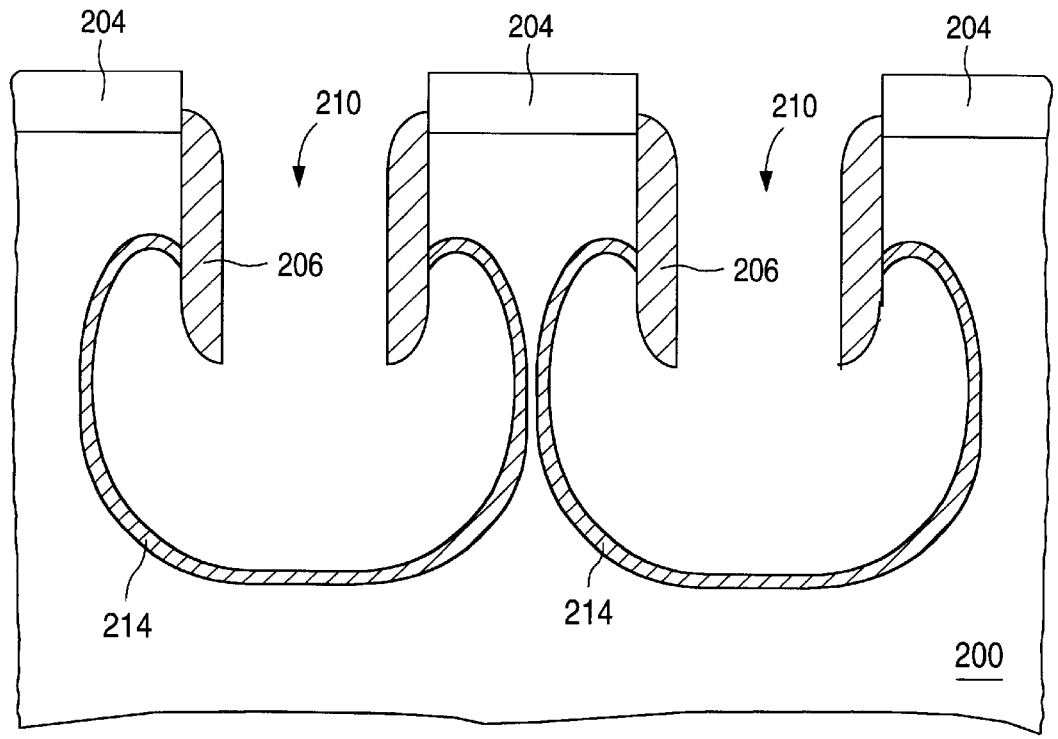

Next, a silicon dioxide ($SiO_2$) trench liner layer 214 is formed on those portions of the sidewalls of the expanded trench 210 that are not covered by the dielectric shallow trench spacer 206. The resultant structure is shown in FIG. 8. The $SiO_2$ trench liner layer can be formed using conventional thermal oxidation techniques and has a thickness, for example, in the range of 25 angstroms to 300 angstroms. If desired, the $SiO_2$ trench liner layer 214 can be formed subsequent to first forming a sacrificial silicon dioxide layer (not shown in the FIGs.) on those portions of the sidewalls of the expanded trench 210 that are not covered by the dielectric shallow trench spacer 206 and then removing the sacrificial silicon dioxide layer. The use of such a sacrificial silicon dioxide layer can serve to remove any damage created in those portions of the expanded trench 210 where the $SiO_2$ trench liner layer 214 is to be formed due to the prior isotropic etch. Following formation of the $SiO_2$ trench liner layer 214, the narrowest width of the vertical-channel region 212 can be, for example, 0.08 to 0.12 microns in width.

Figure 9:
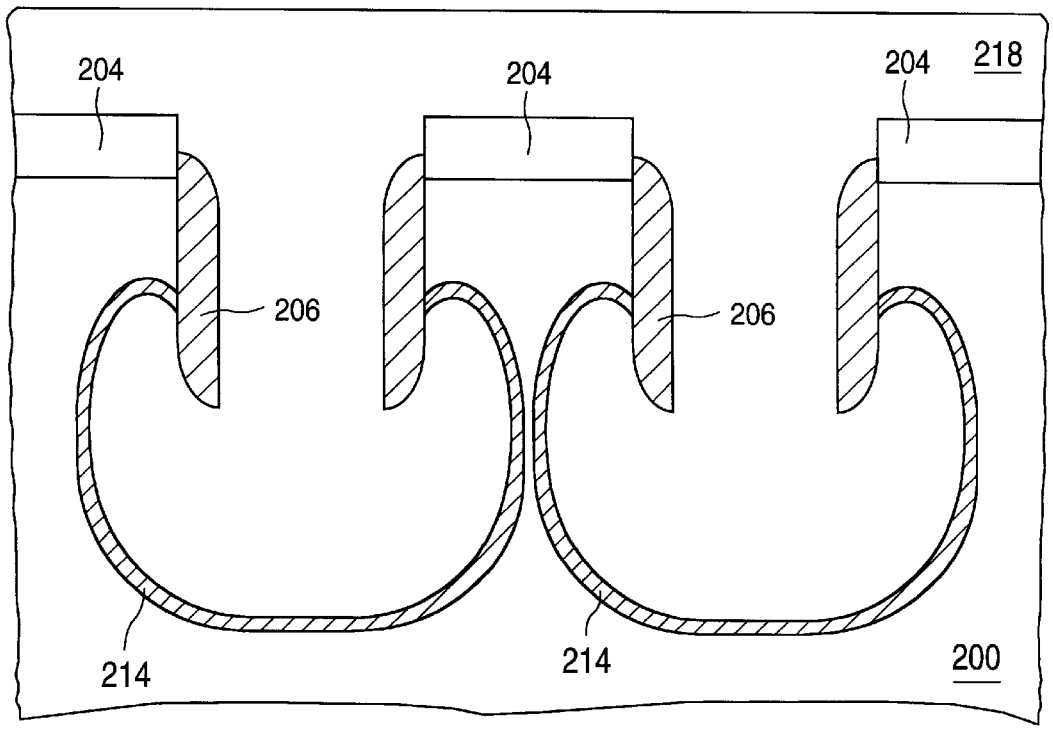
Figure 10:
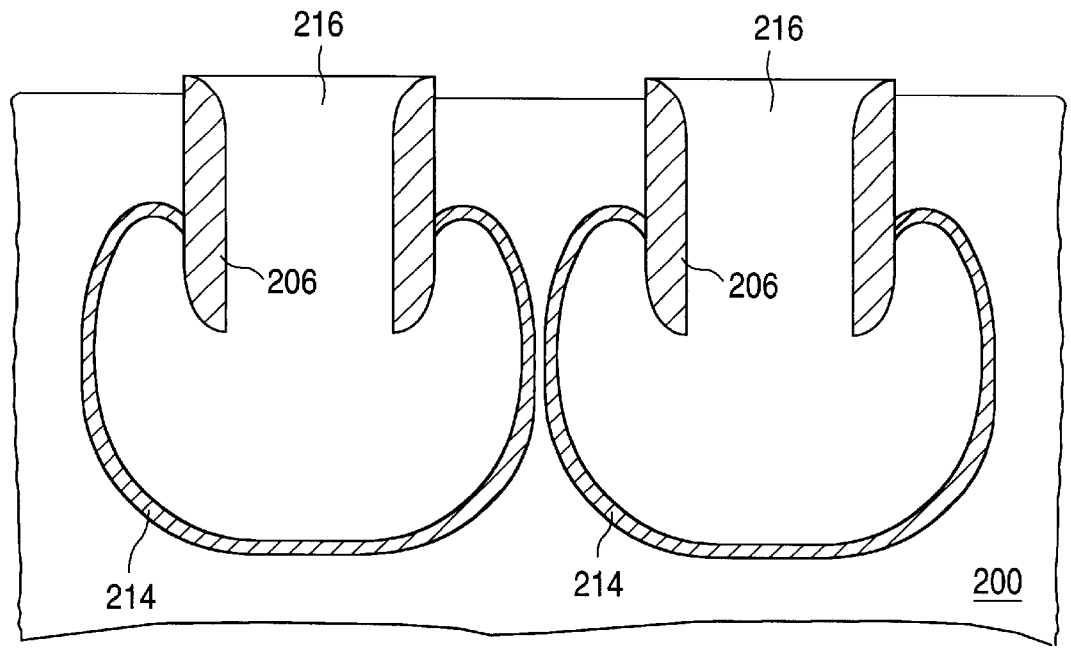

Next, the expanded trench 210 is filled with an electrically conductive trench fill layer 216. This step can be accomplished, for example, by depositing an electrically conductive material layer 218 (for example, in-situ doped polysilicon layer) in the expanded trench 210 and covering the patterned hard mask layer 204, as illustrated in FIG. 9. The doping level for such an in-situ doped polysilicon layer is preferably as high as possible in order to provide a low resistance and enhanced "pinch-off" control of the vertical-channel region 212. When the electrically conductive trench fill layer 216 is formed using conventional in-situ doped polysilicon deposition techniques, its doping level is typically in the range of $1E22$ atoms/$cm^3$ to $1E23$ atoms/$cm^3$. The electrically conductive material layer 218 is then etched-back or planarized using conventional etching or chemical mechanical planarization (CMP) techniques to form an electrically conductive trench fill layer 216 in the expanded trench 210. The patterned hard mask 204 is subsequently removed using conventional techniques. For example, a patterned hard mask 204 that is composed of a layer of silicon nitride overlying a layer of silicon dioxide can be removed using well known wet etchants, such as hot phosphoric acid and HF acid, respectively. The resultant structure is illustrated in FIG. 10.

Figure 11:
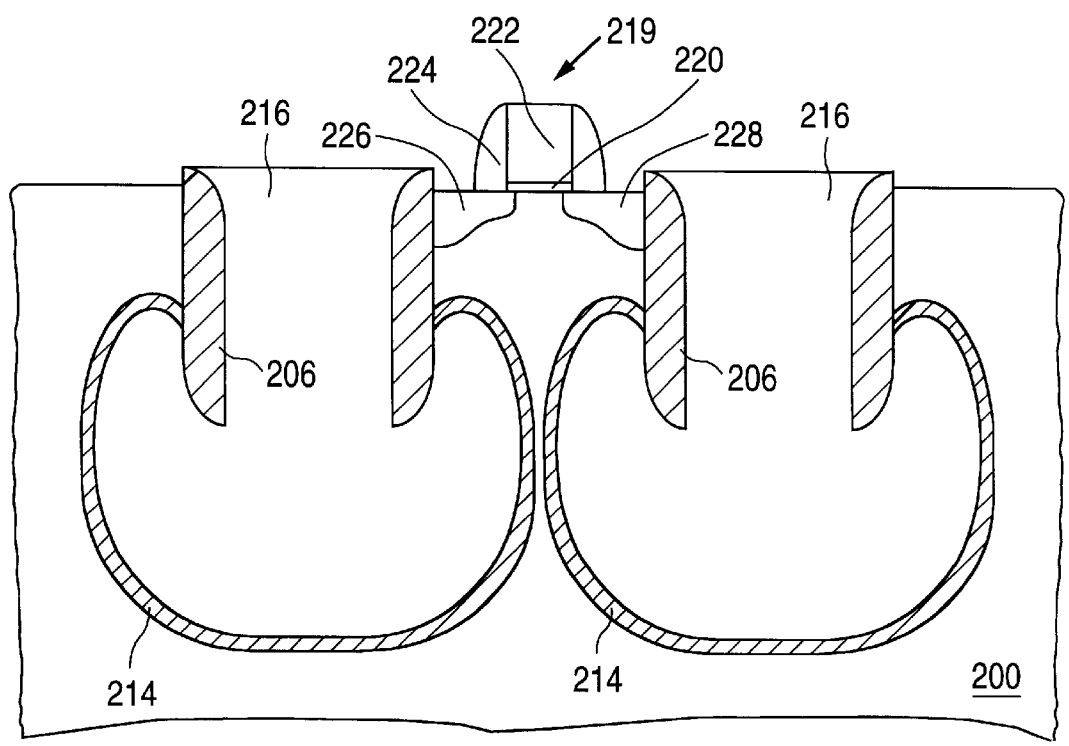

Finally, a conventional MOSFET structure 219 is formed on the semiconductor substrate 200 in the active area region 205. The resultant structure is illustrated in FIG. 11. The conventional MOSFET structure 219 includes a gate silicon dioxide layer 220 (for example, 20 angstroms to 300 angstroms thick) on the semiconductor substrate 200. Gate silicon dioxide layer 220 can be formed using conventional techniques such as thermal oxidation. A silicon gate layer 222 (typical thickness being, for example, in the range between 1000 angstroms and 1500 angstroms) overlies the gate silicon dioxide layer 220. Silicon gate layer 222 can be formed of, for example, either amorphous silicon or polysilicon using conventional deposition and patterning techniques. Conventional MOSFET structure 219 also includes a gate sidewall spacer 224, which abuts the lateral surfaces of silicon gate layer 222 and gate silicon dioxide layer 220. These gate sidewall spacers 224 are made, for example, of CVD silicon nitride, silicon dioxide, or combination of silicon nitride and silicon dioxide and have a typical width (measured at the bottom of the gate sidewall spacer 224) in the range of 500 angstroms to 1000 angstroms. Also included in the conventional MOSFET structure 219 are source and drain regions 226 and 228 of a second conductivity type.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A semiconductor device comprising:

a semiconductor substrate of a first conductivity type;

an MOSFET device structure formed in the semiconductor substrate; and at least one vertical-channel trench-substrate field effect device formed in the semiconductor substrate, the vertical-channel trench-substrate field effect device including a vertical-channel region formed vertically beneath the MOSFET structure.

2. The semiconductor device of claim 1, wherein the MOSFET structure includes:

a gate silicon dioxide layer on the semiconductor substrate;

a silicon gate layer overlying the gate silicon dioxide layer; and source and drain regions of a second conductivity type formed in the semiconductor substrate;

wherein the at least one vertical-channel trench-substrate field effect device includes:

an expanded trench extending from the upper surface of the semiconductor substrate to beneath the MOSFET structure;

a dielectric shallow trench spacer disposed along the sidewall of an upper portion of the expanded trench and adjacent to the source and drain regions of the MOSFET structure;

a $SiO_2$ trench liner layer disposed on the sidewalls of the expanded trench; and an electrically conductive trench fill layer formed in the expanded trench.

3. The semiconductor device of claim 1 wherein, during operation of the semiconductor device, the application of a potential bias to the electrically conductive trench fill layer controllably tunes substrate current exiting the MOSFET device structure through the vertical-channel region.

4. The semiconductor device of claim 2 wherein the vertical-channel trench-substrate field effect device further includes an electrical contact to the electrically conductive trench fill layer, and wherein, during operation of the semiconductor device, the application of a potential bias to the electrically conductive trench fill layer via the electrical contact controllably tunes substrate current exiting the MOSFET device structure through the vertical-channel region.

5. The semiconductor device of claim 2 wherein the electrically conductive trench fill layer is an in-situ doped polysilicon layer.

6. The semiconductor device of claim 2 wherein the narrowest width of the vertical-channel region is in the range of 0.08 to 0.12 microns.

7. The semiconductor device of claim 1 wherein the MOSFET device structure is a portion of an ESD protection device.

8. The semiconductor device of claim 1 wherein the MOSFET device structure is a portion of a CMOS device structure.

* * * * *